United States Patent
Zhao

(10) Patent No.: US 8,970,270 B2
(45) Date of Patent: Mar. 3, 2015

(54) DUTY CYCLE ADJUSTING CIRCUIT AND ADJUSTING METHOD

(71) Applicant: iWatt Integrated Circuits Technology (Tianjin) Limited, Tianjin (CN)

(72) Inventor: Xiaogang Zhao, Tianjin (CN)

(73) Assignee: iWatt Integrated Circuits Technology (Tianjin) Limited, Tianjin (CN)

( * ) Notice: Subject to any disclaimer, the term of this patent is extended or adjusted under 35 U.S.C. 154(b) by 0 days.

(21) Appl. No.: 14/097,114

(22) Filed: Dec. 4, 2013

(65) Prior Publication Data

US 2014/0152362 A1      Jun. 5, 2014

(30) Foreign Application Priority Data

Dec. 5, 2012  (CN) .......................... 2012 1 0520690

(51) Int. Cl.
*H03K 3/017* (2006.01)

(52) U.S. Cl.
CPC ..................................... *H03K 3/017* (2013.01)
USPC .......................................................... 327/175

(58) Field of Classification Search
USPC ......................................... 327/291, 172, 175
See application file for complete search history.

(56) References Cited

U.S. PATENT DOCUMENTS 7,800,419 B2 *   9/2010   Payrard et al. ................ 327/140

* cited by examiner

*Primary Examiner* — Daniel Rojas
(74) *Attorney, Agent, or Firm* — Fenwick & West LLP

(57) ABSTRACT

The present invention relates to a square wave generator circuit, an integrated circuit, a DC/DC converter and an AC/DC converter. The square wave generator circuit comprises a first mirror current branch which is connected with ground via a first switching element and a first capacitor in parallel with the first switching element, wherein the first switching element is operable to be opened or closed periodically under control of a first clock signal so as to generate a first sawtooth wave signal at a non-grounded terminal of the first capacitor; a second mirror current branch which is connected with ground via a second switching element and a second capacitor in parallel with the second switching element, wherein the second switching element is operable to be opened or closed periodically under control of a second clock signal synchronous with the first clock signal so as to generate a second sawtooth wave signal at a non-grounded terminal of the second capacitor; and a comparator, one input terminal of which is connected to the non-grounded terminal of the first capacitor and the other input terminal of which is connected to the non-grounded terminal of the second capacitor, so that a square wave signal can be outputted at an output terminal of the comparator, wherein a duty cycle of the square wave signal depends on a ratio of a capacitance of the second capacitor to a capacitance of the first capacitor.

14 Claims, 4 Drawing Sheets

DUTY CYCLE ADJUSTING CIRCUIT AND ADJUSTING METHOD

FIELD OF THE INVENTION

Embodiments of the present invention relate to a square wave generator circuit, an integrated circuit comprising the square wave generator circuit, a DC/DC converter, and an AC/DC converter.

BACKGROUND OF THE INVENTION

A square wave generator circuit is a signal generator circuit extensively used in integrated circuits. FIG. 1 illustrates a schematic diagram of a square wave generator circuit in the prior art. As shown in FIG. 1, a square wave generator circuit 10 comprises a constant current source 101 and a capacitor 102 connected in series between an operating voltage VDD and ground. A switch 103 is connected in parallel between both terminals of the capacitor 102. The switch 103 periodically opens or closes under control of a clock signal clk with a very narrow pulse width (e.g., with a 1% duty cycle), so that a sawtooth wave signal vramp is generated at a non-grounded terminal of the capacitor 102. The square wave generator circuit 10 further comprises a comparator 104. An in-phase input terminal of the comparator 104 receives a reference voltage signal vref, and an anti-phase input terminal of the comparator 104 is connected to the non-grounded terminal of the comparator 102 so that a square wave signal is outputted at an output terminal of the comparator 104.

Assuming that a duration of a high level of the generated square wave signal be t1 and a clock cycle of the clock signal clk be T, a voltage Vrap of the generated sawtooth wave signal vramp may be expressed as: Vrap=(t*I)/C, where t is a charging time of the capacitor, I is a charging current of the capacitor, and C is a capacitance of the capacitor. At a turning point of the comparator 104, there exists Vrap=Vref, wherein Vref is a voltage of a reference voltage signal vref. Therefore, it can be obtained that t1=C*Vref/I. Hence, the duty cycle of the generated square wave signal duty=C*Vref/I*T. In view of the above, the duty cycle of the square wave signal is associated with all of the capacitor C of the capacitor, the voltage Vref of the reference voltage signal vref, the charging current I and the clock cycle T of the clock signal clk. Therefore, once one of the above parameters changes, the duty cycle of the square wave signal will change, thereby causing a deviation of the duty cycle of the square wave signal in different clock cycles. That it to say, the duty cycle of the square wave signal has a lower precision.

However, the square wave signal with a high-precision duty cycle usually needs to be used in many applications. For example, in a DC/DC or AC/DC circuit, a square wave signal with a high-precision duty cycle needs to be used for precisely controlling a waveform of a PWM signal generated by a PWM signal generator. Hence, the square wave generator circuit in the prior art cannot meet requirements in practical applications.

SUMMARY OF THE INVENTION

Embodiments of the present invention provides a square wave generator circuit, and an integrated circuit comprising the square wave generator circuit to solve or at least partially ease the above problems existing in the prior art.

In a first aspect, embodiments of the present invention provide a square wave generator circuit. The square wave generator circuit comprises: a first mirror current branch which is connected with ground via a first switching element and a first capacitor in parallel with the first switching element, wherein the first switching element is operable to be opened and closed periodically under control of a first clock signal so as to generate a first sawtooth wave signal at a non-grounded terminal of the first capacitor; a second mirror current branch which is connected with ground via a second switching element and a second capacitor in parallel with the second switching element, wherein the second switching element is operable to be opened or closed periodically under control of a second clock signal synchronous with the first clock signal so as to generate a second sawtooth wave signal at a non-grounded terminal of the second capacitor; and a comparator, one input terminal of which is connected to the non-grounded terminal of the first capacitor and the other input terminal of which is connected to the non-grounded terminal of the second capacitor, so that a square wave signal can be outputted at an output terminal of the comparator, wherein a duty cycle of the square wave signal depends on a ratio of a capacitance of the second capacitor to a capacitance of the first capacitor.

In a second aspect, embodiments of the present invention provide an integrated circuit comprising the above square wave generator circuit.

In a third aspect, embodiments of the present invention provide a DC/DC converter comprising the above integrated circuit.

In a fourth aspect, embodiments of the present invention provide an AC/DC converter comprising the above integrated circuit.

The duty cycle of the square wave signal generated by the square wave generator circuit according to embodiments of the present invention depends on a ratio of a capacitance of the first capacitor to a capacitance of the second capacitor. Once the ratio is determined, the duty cycle of the generated square wave signal will substantially remain invariable so that the duty cycle of the square wave signal has a higher precision. Hence, in practical applications, the square wave signal with the high-precision duty cycle can be used for precisely controlling a waveform of the PWM signal generated by the PWM signal generator for example in a DC/DC or AC/DC circuit.

DETAILED DESCRIPTION OF EMBODIMENTS

In a first aspect, embodiments of the present invention provide a square wave generator circuit. The square wave generator circuit according to embodiments of the present invention will be described in detail with reference to FIGS. 2-6.

Figure 1:
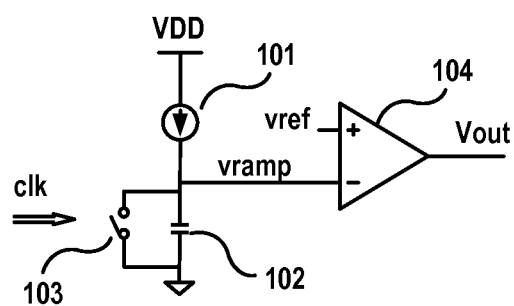
FIG. 1 illustrates a schematic diagram of a square wave generator circuit in the prior art.
Figure 2:
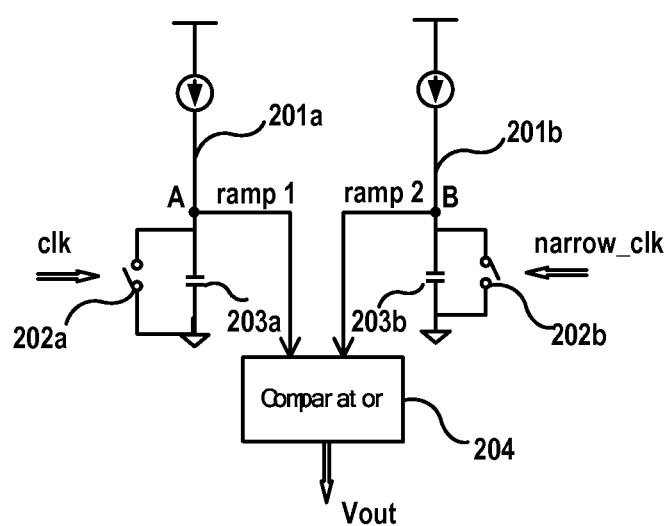
FIG. 2 illustrates a schematic diagram of a square wave generator circuit according to an embodiment of the present invention.

FIG. 2 illustrates a schematic diagram of a square wave generator circuit according to an embodiment of the present invention. As shown in FIG. 2, a square wave generator circuit 20 comprises a first mirror current branch 201a, a second mirror current branch 201b and a comparator 204. For the purpose of illustration, the first mirror current branch 201a and the second mirror current branch 201b are illustrated in the form of a constant current source respectively. However, those skilled in the art may appreciate that the first mirror current branch 201a and the second mirror current branch 201b may be implemented respectively as, for example, one mirror current branch of a mirror current source circuit.

The first mirror current branch 201a is connected with ground via a first switching element 202a and a first capacitor 203a connected in parallel with the first switching element 202a. The first switching element 202a is operable to be opened and closed periodically under control of a first clock signal clk so that a first sawtooth wave signal ramp1 is generated at a non-grounded terminal A of the first capacitor 203a. The first clock signal clk may be, for example, a square wave signal with a 50% duty cycle provided from outside the square wave generator circuit.

The second mirror current branch 201b is connected with ground via a second switching element 202b and a second capacitor 203b in parallel with the second switching element 202b. The second switching element 202b is operable to be opened and closed periodically under control of a second clock signal narrow_clk synchronous with the first clock signal clk so that a second sawtooth wave signal ramp2 is generated at a non-grounded terminal B of the second capacitor 203b. The second clock signal narrow_clk may be, for example, a square wave signal generated based on the first clock signal clk and having a duty cycle less than 4% (this clock signal may be called a narrow clock signal or narrow_clk). In one example, the second clock signal narrow_clk is a square wave signal generated based on the first clock signal clk and having a duty cycle less than 1%. A clock signal converting circuit for generating the second clock signal narrow_clk based on the first clock signal clk will be described in detail later.

One input terminal of the comparator 204 is connected to the non-grounded terminal A of the first capacitor 203a, and the other input terminal of the comparator 204 is connected to the non-grounded terminal B of the second capacitor 203b, so that the square wave signal may be outputted at the output terminal of the comparator 204. A duty cycle of the square wave signal Vout depends on a ratio of a capacitance of the second capacitor 203b to a capacitance of the first capacitor 203a. For example, in the case where the ratio of a capacitance of the second capacitor 203b to a capacitance of the first capacitor 203a is greater than 1, the duty cycle of the square wave signal Vout may reduce as the ratio increases.

Figure 3:
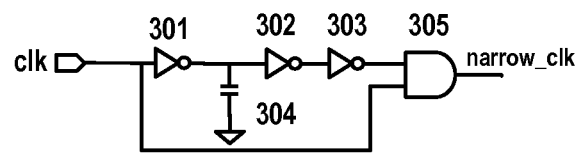
FIG. 3 illustrates a schematic diagram of an example of a clock signal converting circuit which may be applied to embodiments of the present invention.

FIG. 3 illustrates a schematic diagram of an example of a clock signal converting circuit which may be applied to embodiments of the present invention. As shown in FIG. 3, a clock signal converting circuit 30 comprises: a first inverter 301, a second inverter 302 and a third inverter 303 connected in series, a capacitor 304 connected between an output terminal of the first inverter 301 and ground, and an AND gate 305. An input terminal of the first inverter 301 is operable to receive the first clock signal clk; one input terminal of the AND gate 305 is connected to an output terminal of the third inverter 303 and the other input terminal of the AND gate 305 is connected to the input terminal of the first inverter 301 so as to output the second clock signal narrow_clk at an output terminal of the AND gate 305. A pulse width of the generated second clock signal narrow_clk depends on a capacitance of the capacitor 304. Hence, the capacitance of the capacitor 304 may be appropriately selected according to a desired pulse width of the second clock signal narrow_clk.

Figure 4:
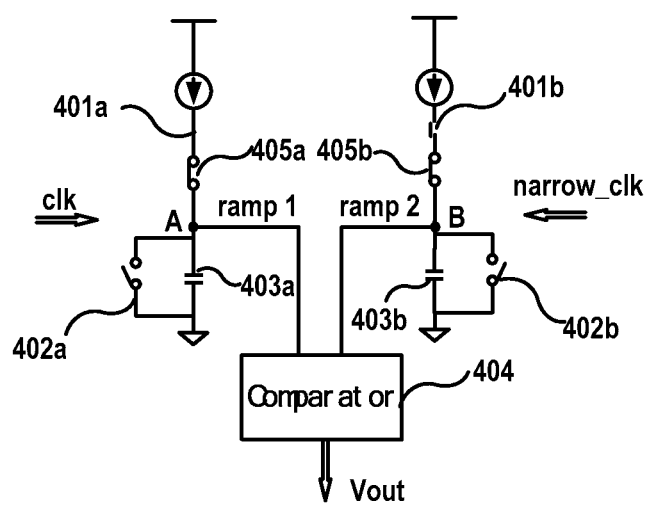
FIG. 4 illustrates a schematic diagram of a square wave generator circuit according to another embodiment of the present invention.

According to another embodiment of the present invention, the square wave generator circuit further comprises a third switching element connected between the first mirror current branch and the first switching element, and a fourth switching element connected between the second mirror current branch and the second switching element, as shown in FIG. 4.

A square wave generator circuit 40 as shown in FIG. 4 comprises a first mirror current branch 401a, a second mirror current branch 401b and a comparator 404. In FIG. 4, also for the purpose of illustration, the first mirror current branch 401a and the second mirror current branch 401b are illustrated in the form of a constant current source respectively. However, those skilled in the art can appreciate that similar to the embodiment as shown in FIG. 2, the first mirror current branch 401a and the second mirror current branch 401b may be implemented respectively as, for example, a mirror current branch of a mirror current source circuit.

The first mirror current branch 401a is connected with ground via a first switching element 402a, a third switching element 405a and a first capacitor 403a connected in parallel with the first switching element 402a. The first switching element 402a and the third switching element 405a are operable to be opened and closed alternately under control of a first clock signal clk so that a first sawtooth wave signal ramp1 is generated at a non-grounded terminal A of the first capacitor 403a. The first clock signal clk may be, for example, a square wave signal with a 50% duty cycle provided from outside the square wave generator circuit.

The second mirror current branch 401b is connected with ground via a second switching element 402b, a fourth switching element 405b and a second capacitor 403b connected in parallel with the second switching element 402b. The second switching element 402b and the fourth switching element 405b are operable to be opened and closed alternately under control of a second clock signal narrow_clk so that a second sawtooth wave signal ramp2 is generated at a non-grounded terminal B of the second capacitor 403b. The second clock signal narrow_clk may be, for example, a square wave signal generated based on the first clock signal clk and having a duty cycle less than 1%, by using the clock signal converting circuit 30 as shown in FIG. 3.

One input terminal of the comparator 404 is connected to the non-grounded terminal A of the first capacitor 403a, and the other input terminal of the comparator 404 is connected to the non-grounded terminal B of the second capacitor 403b, so that the square wave signal Vout may be outputted at an output terminal of the comparator 404. A duty cycle of the square wave signal Vout depends on a ratio of a capacitance of the second capacitor 403b to a capacitance of the first capacitor 403a. For example, in the case where the ratio of a capacitance of the second capacitor 403b to a capacitance of the first capacitor 403a is greater than 1, the duty cycle of the square wave signal Vout may reduce as the ratio increases.

Figure 5:
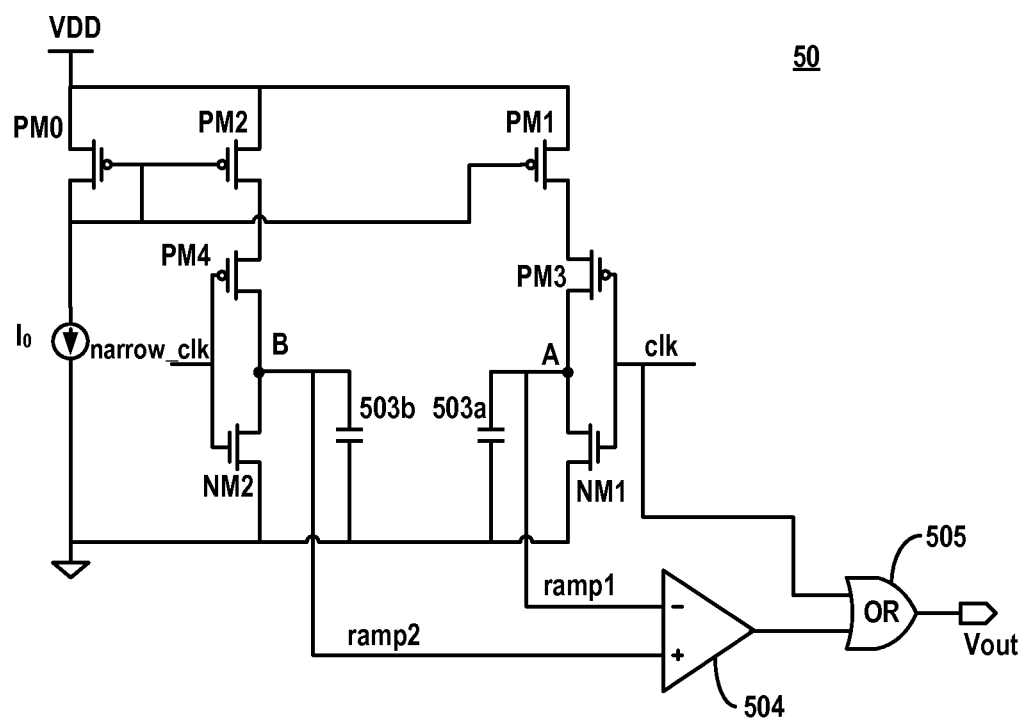
FIG. 5 illustrates a schematic diagram of a square wave generator circuit according to a further embodiment of the present invention.

FIG. 5 illustrates a schematic diagram of a square wave generator circuit according to a further embodiment of the present invention. As described above, a first mirror current branch and a second mirror current branch may be implemented respectively as a mirror current branch of a mirror current source circuit, as shown in FIG. 5. In the square wave generator circuit as shown in FIG. 5, the mirror current source circuit comprises: a reference current branch comprising a reference P-MOS transistor PM0 and a constant current source $I_0$, a first mirror current branch comprising a first P-MOS transistor PM1 and a second mirror current branch comprising a second P-MOS transistor PM2. The reference P-MOS transistor, the first P-MOS transistor and the second P-MOS transistor each may be, for example, a low-voltage MOS transistor and have the same properties such as a break-over voltage.

A source of the reference P-MOS transistor PM0 is connected to an operation voltage VDD of a square wave generator circuit 50, a gate of the reference P-MOS transistor PM0 is connected to a drain of the reference P-MOS transistor PM0, and the drain of the reference P-MOS transistor PM0 is grounded via a constant current source $I_0$. A gate of the first P-MOS transistor PM1 and a gate of the second P-MOS transistor PM2 are both connected to the gate of the reference P-MOS transistor PM0, a source of the first P-MOS transistor PM1 and a source of the second P-MOS transistor PM2 are both connected to the operation voltage VDD. Therefore, a constant current generated in the reference current branch is mirrored to the first mirror current branch and the second mirror current branch respectively.

As shown in FIG. 5, between a drain of the first P-MOS transistor PM1 and ground are connected a first N-MOS transistor NM1 and a third P-MOS transistor PM3 each serving as a switching element, and a first capacitor 503a connected in parallel with the first N-MOS transistor NM1. The first N-MOS transistor NM1 and the third P-MOS transistor PM3 each may be, for example, a low-voltage MOS transistor. A source of the first N-MOS transistor NM1 is grounded, and a drain of the first N-MOS transistor NM1 and a gate of the first N-MOS transistor NM1 are respectively connected to a drain and a gate of the third P-MOS transistor PM3, and the source of the third P-MOS transistor PM3 is connected to the drain of the first P-MOS transistor PM1. The gate of the first N-MOS transistor NM1 and the gate of the third P-MOS transistor PM3 receive the first clock signal clk so that the first N-MOS transistor NM1 and the third P-MOS transistor PM3 can be opened and closed alternately under control of the first clock signal clk so as to generate a first sawtooth wave signal ramp1 at the non-grounded terminal A of the first capacitor 503a. The first clock signal clk may be, for example, a square wave signal with a 50% duty cycle provided from outside the square wave generator circuit.

Between a drain of the second P-MOS transistor PM2 and ground are connected a second N-MOS transistor NM2 and a fourth P-MOS transistor PM4 each serving as a switching element, and a first capacitor 503b connected in parallel with the second N-MOS transistor NM2. The second N-MOS transistor NM2 and the fourth P-MOS transistor PM4 each may be, for example, a low-voltage MOS transistor. A source of the second N-MOS transistor NM2 is grounded, and its drain and gate are respectively connected to a drain and a gate of the fourth P-MOS transistor PM4, and the source of the fourth P-MOS transistor PM4 is connected to the drain of the second P-MOS transistor PM2. The gate of the second N-MOS transistor NM2 and the gate of the fourth P-MOS transistor PM4 receive the second clock signal narrow_clk so that the second N-MOS transistor NM2 and the fourth P-MOS transistor PM4 can be opened and closed alternately under control of the second clock signal narrow_clk so as to generate a second sawtooth wave signal ramp2 at the non-grounded terminal B of the second capacitor 503b. The second clock signal narrow_clk may be, for example, a square wave signal generated based on the first clock signal clk and having a duty cycle less than 1%, by using the clock signal converting circuit 30 as shown in FIG. 3.

As shown in FIG. 5, the square wave generator circuit 50 further comprises a comparator 504. An anti-phase input terminal of the comparator 504 is connected to the non-grounded terminal A of the first capacitor 503a, and an in-phase input terminal of the comparator 504 is connected to the non-grounded terminal B of the second capacitor 503b so that the square wave signal may be outputted at the output terminal of the comparator 504. A duty cycle of the square wave signal depends on a ratio of a capacitance of the second capacitor 503b to a capacitance of the first capacitor 503a.

Besides, the square wave generator circuit as shown in FIG. 5 further comprises an OR gate 505 which performs a logical OR operation on the square wave signal outputted by the comparator 504 and the first clock signal clk to lock the signal during a high level of the square wave signal outputted by the comparator 504, so as to prevent, for example, noise from interfering with the generated high-level signal.

Figure 6:
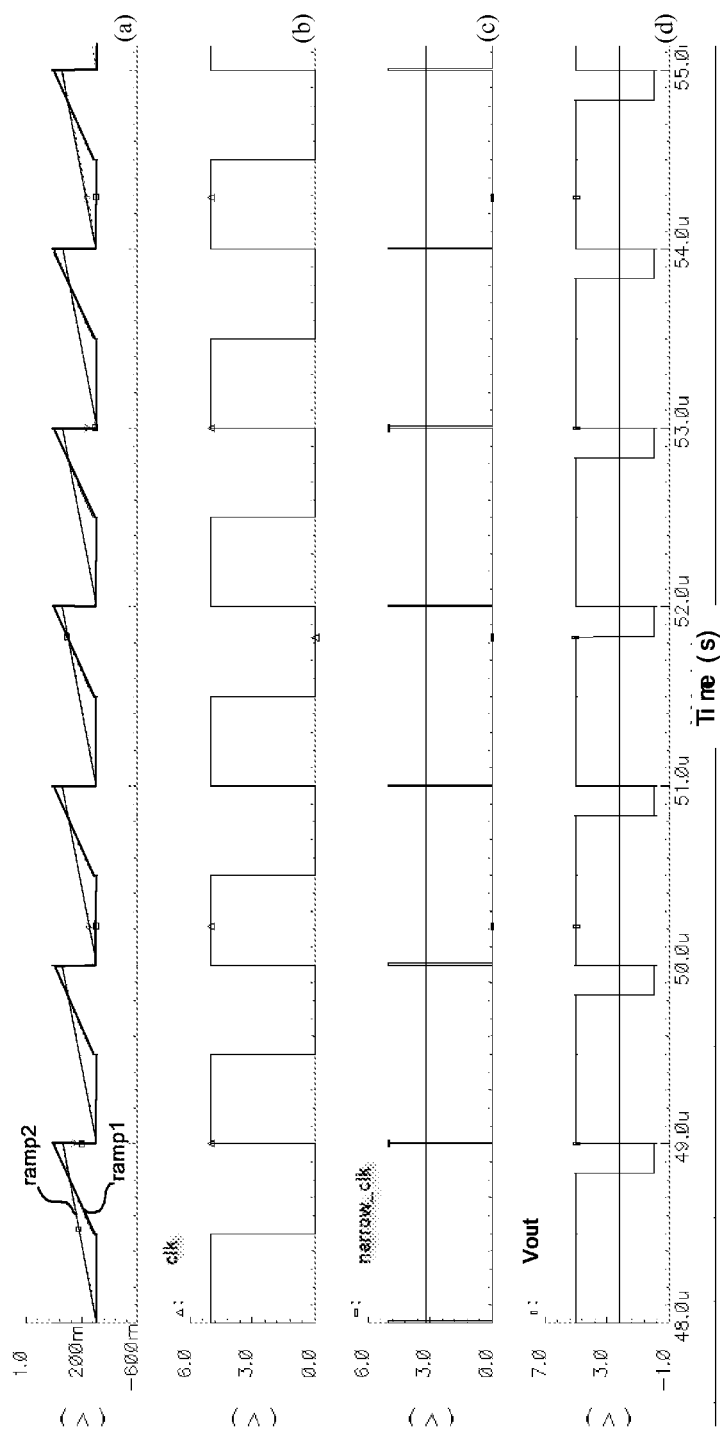
FIG. 6 illustrates a sequence diagram of the square wave generator circuit as shown in FIG. 5.

FIG. 6 illustrates a sequence diagram of the square wave generator circuit as shown in FIG. 5. An operating principle of the square wave generator circuit as shown in FIG. 5 is described below in combination with the sequence diagram as shown in FIG. 6.

FIG. 6(a) illustrates waveforms of the first sawtooth wave signal ramp1 generated at the non-grounded terminal A of the first capacitor 503a and a second sawtooth wave signal ramp2 generated at the non-grounded terminal B of the second capacitor 503b. FIG. 6(b) illustrates a waveform of the first clock signal clk applied to the gate of the first N-MOS transistor NM1 and the gate of the third P-MOS transistor PM3. The first clock signal clk is a square wave signal with a 50% duty cycle. FIG. 6(c) illustrates a waveform of the second clock signal narrow_clk applied to the gate of the second N-MOS transistor NM2 and the gate of the fourth P-MOS transistor PM4. The second clock signal narrow_clk may be, for example, a square wave signal generated based on the first clock signal clk and having a duty cycle less than 1%, by using the clock signal converting circuit 30 as shown in FIG. 3. FIG. 6(d) illustrates a waveform of the square wave signal Vout generated at an output terminal of the OR gate 505.

Referring to FIG. 6(b) and FIG. 6(a), during a high level of a first clock cycle of the first clock signal clk, the first N-MOS transistor NM1 is turned on whereas the third P-MOS transistor PM3 is turned off. Hence, no current flows through the first capacitor 503a so as not to charge the first capacitor 503a. Therefore, a voltage of the first sawtooth wave signal ramp1 is zero. During a low level of the first clock cycle, the first N-MOS transistor NM1 is turned off whereas the third P-MOS transistor PM3 is turned on so that a mirror current from the first P-MOS transistor PM1 flows through the first capacitor 503a so as to charge the first capacitor 503a. Hence, the voltage of the first sawtooth wave signal ramp1 increases gradually. At the end of the first clock cycle, the first clock signal clk becomes from the low level to the high level so that the third P-MOS transistor PM3 is turned off and the first N-MOS transistor NM1 is turned on so as to discharge the first capacitor 503a. Therefore, the voltage of the first sawtooth wave signal ramp 1 falls transiently to zero. The above operations during the first clock cycle are repeated in subsequent clock cycles. In this way, the waveform of the first sawtooth wave signal ramp1 as shown in FIG. 6(a) is generated.

Referring to FIG. 6(c) and FIG. 6(a), similar to the procedure described with reference to FIG. 6(b) and FIG. 6(a), during a high level of the second clock signal narrow_clk, the second N-MOS transistor NM2 is turned on whereas the fourth P-MOS transistor PM4 is turned off so as to discharge the second capacitor 503b. During a low level of the second clock signal narrow_clk, the second N-MOS transistor NM2 is turned off whereas the fourth P-MOS transistor PM4 is turned on so as to charge the second capacitor 503b. In this way, the waveform of the second sawtooth wave signal ramp2 as shown in FIG. 6(a) is generated.

Then, referring to FIG. 6(a) and FIG. 6(d), when the voltage of the second sawtooth wave signal ramp2 is higher than the voltage of the first sawtooth wave signal ramp1, the comparator 504 outputs a high-level signal; and when the voltage of the second sawtooth wave signal ramp2 is equal to the voltage of the first sawtooth wave signal ramp1, the level of the signal outputted by the comparator 504 turns. The OR gate 505 performs a logical OR operation on the signal outputted by the comparator 504 and the first clock signal clk so as to generate the square wave signal as shown in FIG. 6(d).

Again referring to FIG. 6(a) to FIG. 6(d), assumption is made that a duration of a high level of the generated square wave signal is t1 and a clock cycle of the first clock signal clk is T. In the case where the duty cycle of the first clock signal clk is 50% whereas the duty cycle of the second clock signal narrow_clk is as low as possible (e.g., less than 1%), a voltage Vrap1 of the first sawtooth wave signal ramp1 and a voltage Vrap2 of the second sawtooth wave signal ramp2 may be approximately expressed by the following equations:

$$Vrap1=I*t1/nC1$$

$$Vrap2=(I/C1)*(t1-0.5T)$$

where C1 is a capacitance of the first capacitor 503a, nC1 is a capacitance of the second capacitor 503b, I is a charging current of the first capacitor 503a and the second capacitor 503b. At the turning point of the comparator 504, there exists Vrap1=Vrap2. It can be obtained therefrom that the duty cycle of the generated square wave signal Vout is equal to $1/[2*(1-1/n)]$, where n is a ratio of a capacitance of the second capacitor 503b to a capacitance of the first capacitor 503a, and n>2. As can be seen from the above, the duty cycle of the square wave signal Vout depends on a ratio (i.e., n) of a capacitance of the second capacitor 503b to a capacitance of the first capacitor 503a.

It should be noted that the above expression of the duty cycle of the square wave signal Vout is obtained in the case where the duty cycle of the second clock signal narrow_clk is as low as possible so that it may be neglected. The lower the duty cycle of narrow_clk, the higher the precision of the duty cycle of the obtained square wave signal Vout. A value of the duty cycle of the second clock signal narrow_clk may be appropriately selected according to a desired precision of the duty cycle of the square wave signal Vout. Simulation results indicate that an error of the duty cycle of the square wave signal generated by using the square wave signal generator circuit as shown in FIG. 5 is less than 2%. Hence, the square wave signal with the high-precision duty cycle can be used for precisely controlling a waveform of a PWM signal generated by a PWM signal generator for example in a DC/DC or AC/DC circuit. Besides, it is known from the above duty cycle expression $1/[2*(1-1/n)]$ of the square wave signal Vout that the duty cycle is greater than 50% and less than 1. Hence, the duty cycle of the square wave signal may be considered as an upper limit of the duty cycle of the above PWM signal so that the duty cycle of the PWM signal is not too great, thereby preventing damages to elements in the circuit.

Additionally, it should be appreciated that although FIG. 5 illustrates the mirror current source circuit and the switching elements by taking MOS transistors for example, those skilled in the art can understand that the mirror current source circuit and switching elements may also be implemented in other manners without departing from the spirit and scope of the present invention. For example, bipolar transistors may be used in place of the MOS transistors, which also falls within a protection scope as defined by the appended claims.

In a second aspect, embodiments of the present invention provide an integrated circuit comprising a square wave generator circuit. The square wave generator circuit may be implemented as the above-mentioned square wave generator circuit 20, 40 or 50.

In a third aspect, embodiments of the present invention provide a DC/DC converter comprising the above integrated circuit.

In a fourth aspect, embodiments of the present invention provide an AC/DC converter comprising the above integrated circuit.

Exemplary embodiments of the present invention are described with reference to figures. Those skilled in the art should appreciate that the above embodiments are only examples listed for illustration purpose, not to limit the present invention. Any modifications and equivalent substitutes made according to the teaching of the present invention and within the scope of claims should be included in the scope of the present invention.

What is claimed is:

1. A square wave generator circuit, comprising:
   a first mirror current branch which is connected with ground via a first switching element and a first capacitor in parallel with the first switching element, wherein the first switching element is operable to be opened or closed periodically under control of a first clock signal so as to generate, in a first direction, a first sawtooth wave signal at a non-grounded terminal of the first capacitor;
   a second mirror current branch which is connected with ground via a second switching element and a second capacitor in parallel with the second switching element, wherein the second switching element is operable to be opened and closed periodically under control of a second clock signal synchronous with the first clock signal so as to generate, in a same direction as the first direction, a second sawtooth wave signal at a non-grounded terminal of the second capacitor; and
   a comparator, one input terminal of which is connected to the non-grounded terminal of the first capacitor and the other input terminal of which is connected to the non-grounded terminal of the second capacitor, so that a square wave signal can be outputted at an output terminal of the comparator, wherein a duty cycle of the square wave signal depends on a ratio of a capacitance of the second capacitor to a capacitance of the first capacitor.

2. The square wave generator circuit according to claim 1, wherein the ratio of the capacitance of the second capacitor to the capacitance of the first capacitor is greater than one, and wherein the duty cycle of the square wave signal reduces as the ratio increases.

3. The square wave generator circuit according to claim 2, wherein an in-phase input terminal of the comparator is connected to the non-grounded terminal of the second capacitor and an anti-phase input terminal of the comparator is connected to the non-grounded terminal of the first comparator.

4. The square wave generator circuit according to claim 3, wherein the first clock signal is a square wave signal having a duty cycle 50%, and the second clock signal is a square wave signal generated based on the first clock signal and having a duty cycle less than 4%.

5. The square wave generator circuit according to claim 4, wherein the second clock signal has a duty cycle less than 1%.

6. The square wave generator circuit according to claim 1, further comprising a signal clock converting circuit which comprises:
   a first inverter, a second inverter and a third inverter connected in series, an input terminal of the first inverter being operable to receive the first clock signal;
   a capacitor, one terminal of which is connected to an output terminal of the first inverter and the other terminal of which is grounded;
   an AND gate, one input terminal of which is connected to an output terminal of the third inverter and the other input terminal of which is connected to the input terminal of the first inverter so that the second clock signal is outputted at an output terminal of the AND gate.

7. The square wave generator circuit according to claim 4, wherein the duty cycle of the square wave signal outputted by the comparator is equal to $1/[2*(1-1/n)]$, wherein n is the ratio of the capacitance of the second capacitor to the capacitance of the first capacitor, and n is greater than 2.

8. The square wave generator circuit according to claim 1, further comprising:
   a third switching element connected between the first mirror current branch and the first switching element, the third switching element and the first switching element being operable to be opened and closed alternately under control of the first clock signal; and
   a fourth switching element connected between the second mirror current branch and the second switching element, the fourth switching element and the second switching element being operable to be opened and closed alternately under control of the second clock signal.

9. The square wave generator circuit according to claim 8, wherein the first mirror current branch comprises a first P-MOS transistor, the second mirror current branch comprises a second P-MOS transistor, a gate of the first P-MOS transistor and a gate of the second P-MOS transistor are both connected to a gate of a reference P-MOS transistor, a source of the first P-MOS transistor and a source of the second P-MOS transistor are both connected to an operation voltage of the square wave generator circuit, a source of the reference P-MOS transistor is connected to the operation voltage, the gate of the reference P-MOS transistor is connected to a drain thereof, a drain of the reference P-MOS transistor is grounded via a constant current source; and wherein the reference P-MOS transistor, the first P-MOS transistor and the second P-MOS transistor have the same properties.

10. The square wave generator circuit according to claim 9, wherein the first switching element comprises a first N-MOS transistor, the second switching element comprises a second N-MOS transistor, the third switching element comprises a third P-MOS transistor, the fourth switching element comprises a fourth P-MOS transistor, and wherein a source of the first N-MOS transistor is grounded, and a drain and a gate of the first N-MOS transistor are respectively connected to a drain and a gate of the third P-MOS transistor, a source of the third P-MOS transistor is connected to a drain of the first P-MOS transistor, a source of the second N-MOS transistor is grounded and a drain and a gate of the second N-MOS transistor are respectively connected to a drain and a gate of the fourth P-MOS transistor, and a source of the fourth P-MOS transistor is connected to a drain of the second P-MOS transistor.

11. The square wave generator circuit according to claim 1, further comprising an OR gate which performs a logical OR operation on the square wave signal outputted by the comparator and the first clock signal to output another square wave signal.

12. An integrated circuit comprising the square wave generator circuit according to claim 1.

13. A DC/DC converter, comprising the integrated circuit according to claim 12.

14. An AC/DC converter, comprising the integrated circuit according to claim 12.

* * * * *